(12) United States Patent
Postelnicu et al.

(10) Patent No.: US 11,604,147 B2
(45) Date of Patent: Mar. 14, 2023

(54) AMORPHOUS GERMANIUM WAVEGUIDES FOR SPECTROSCOPIC SENSING AND DATA COMMUNICATION APPLICATIONS

(71) Applicant: Massachusetts Institute of Technology, Cambridge, MA (US)

(72) Inventors: Eveline Postelnicu, Somerville, MA (US); Samarth Aggarwal, Ghaziabad (IN); Kazumi Wada, Lexington, MA (US); Jurgen Michel, Arlington, MA (US); Lionel C. Kimerling, Concord, MA (US); Michelle L. Clark, Pelham, NH (US); Anuradha M. Agarwal, Weston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/522,819

(22) Filed: Nov. 9, 2021

(65) Prior Publication Data
US 2022/0065793 A1    Mar. 3, 2022

Related U.S. Application Data

(62) Division of application No. 16/691,007, filed on Nov. 21, 2019, now Pat. No. 11,204,327.
(Continued)

(51) Int. Cl.
*G01N 21/77*    (2006.01)
*G02B 6/125*    (2006.01)
(Continued)

(52) U.S. Cl.
CPC ......... *G01N 21/7746* (2013.01); *G02B 6/125* (2013.01); *H01L 21/02592* (2013.01);
(Continued)

(58) Field of Classification Search
CPC ............... G01N 21/7746; G02B 6/125; H01L 21/02592; H01L 21/02595; H01L 2021/60165
(Continued)

(56) References Cited

U.S. PATENT DOCUMENTS 4,309,225 A    1/1982    Fan et al.
8,062,963 B1    11/2011    van Dal
(Continued)

OTHER PUBLICATIONS

Bandaru et al., "Fabrication and characterization of low temperature (< 450 C) grown p-Ge/n-Si photodetectors for silicon based photonics." Materials Science and Engineering: B 113.1 (2004): 79-84.
(Continued)

*Primary Examiner* — Jerry M Blevins
(74) *Attorney, Agent, or Firm* — Smith Baluch LLP

(57) ABSTRACT

A layer of amorphous Ge is formed on a substrate using electron-beam evaporation. The evaporation is performed at room temperature. The layer of amorphous Ge has a thickness of at least 50 nm and a purity of at least 90% Ge. The substrate is complementary metal-oxide-semiconductor (CMOS) compatible and is transparent at Long-Wave Infrared (LWIR) wavelengths. The layer of amorphous Ge can be used as a waveguide in chemical sensing and data communication applications. The amorphous Ge waveguide has a transmission loss in the LWIR of 11 dB/cm or less at 8 μm.

20 Claims, 12 Drawing Sheets

Related U.S. Application Data

(60) Provisional application No. 62/770,370, filed on Nov. 21, 2018.

(51) Int. Cl.
  *H01L 21/60* (2006.01)
  *H01L 21/02* (2006.01)

(52) U.S. Cl.
  CPC .................. *H01L 21/02595* (2013.01); *H01L 2021/60165* (2013.01)

(58) Field of Classification Search
  USPC .......................................... 385/12
  See application file for complete search history.

(56) References Cited

U.S. PATENT DOCUMENTS

| | | |
|---|---|---|
| 11,204,327 B2 | 12/2021 | Postelnicu et al. |
| 2015/0064852 A1 | 3/2015 | Wakimoto |
| 2015/0171240 A1 | 6/2015 | Kapur et al. |
| 2015/0228813 A1 | 8/2015 | Wertsberger et al. |
| 2018/0143376 A1 | 5/2018 | Kamei et al. |

OTHER PUBLICATIONS

Chaudhuri et al., "Hydrogenated Amorphous Germanium Optical Fiber." Novel Optical Materials and Applications. Optical Society of America, 2015. 2 pages.

Chew et al., "Oblique Angle Deposition of Germanium Film on Silicon Substrate." (2005). 5 pages.

Clark et al., "Simple extension to the Fabry-Perot technique for accurate measurement of losses in semiconductor waveguides." Optics letters 15.22 (1990): 1291-1293.

Clark, "Electrical and optical properties of amorphous germanium." Physical Review 154.3 (1967): 750. 8 pages.

Dubey et al., "Germanium waveguide for optical interconnects in very large scale integrated optics." Functional Photonic and Fiber Devices. vol. 2695. International Society for Optics and Photonics, 1996. 9 pages.

Gallacher et al., "Low loss Ge-on-Si waveguides operating in the 8-14 μm atmospheric transmission window." Optics express 26.20 (2018): 25667-25675.

Gat et al., "Chemical detection using the airborne thermal infrared imaging spectrometer (TIRIS)." Electro-Optical Technology for Remote Chemical Detection and Identification II. vol. 3082. International Society for Optics and Photonics, 1997. 10 pages.

Ge—Germanium Optical properties. NSM Archive. Accessed at http://www.ioffe.ru/SVA/NSM/Semicond/Ge/optic.html on Mar. 6, 2020, 4 pages.

Hernández-Montero et al., "Optical and compositional properties of amorphous silicon-germanium films by plasma processing for integrated photonics." Optical Materials Express 2.4 (2012): 358-370.

Hirose et al., "Electrical and optical properties of amorphous germanium." Japanese Journal of Applied Physics 13.1 (1974): 40. 7 pages.

International Search Report and Written Opinion in International Patent Application No. PCT/US2019/062616 dated Mar. 10, 2020, 24 pages.

Masini, G., et al. "Advances in the field of poly-Ge on Si near infrared photodetectors." Materials Science and Engineering: B 69 (2000): 257-260.

Mehta et al., "Mid-infrared transmission properties of amorphous germanium optical fibers." Applied Physics Letters 97.7 (2010): 071117. 9 pages.

Millar et al., "Low loss germanium-on-silicon waveguides for integrated mid-infrared photonics." Silicon Photonics XIV. vol. 10923. International Society for Optics and Photonics, 2019. 9 pages.

Nedeljkovic et al., "Predictions of free-carrier electroabsorption and electrorefraction in germanium." IEEE Photonics Journal 7.3 (2015): 1-14.

Regener et al., "Loss in low-finesse Ti: LiNbO 3 optical waveguide resonators." Applied physics B 36.3 (1985): 143-147.

Schmidtchen et al., "Germanium-diffused waveguides in silicon for lambda= 1.3 mu m and lambda= 1.55 mu m with losses below 0.5 dB/cm." IEEE photonics technology letters 4.8 (1992): 875-877.

Silicon Datasheet. TYDEX. Accessed at http://www.tydexoptics.com/materials1/for_transmission_optics/silicon/ on Feb. 21, 2020. 2 pages.

Singh et al., "Mid-infrared materials and devices on a Si platform for optical sensing." Science and technology of advanced materials 15.1 (2014): 014603.

Soref, "Mid-infrared photonics in silicon and germanium." Nature photonics 4.8 (2010): 495. 3 pages.

Sze et al., Physics of semiconductor devices. John wiley & sons, 2006. 763 pages.

Tauc, "Optical properties and electronic structure of amorphous Ge and Si." Materials Research Bulletin 3.1 (1968): 37-46.

Walley et al., "Electrical conduction in amorphous germanium." Thin Solid Films 1.5 (1968): 367-377.

Figure 1A
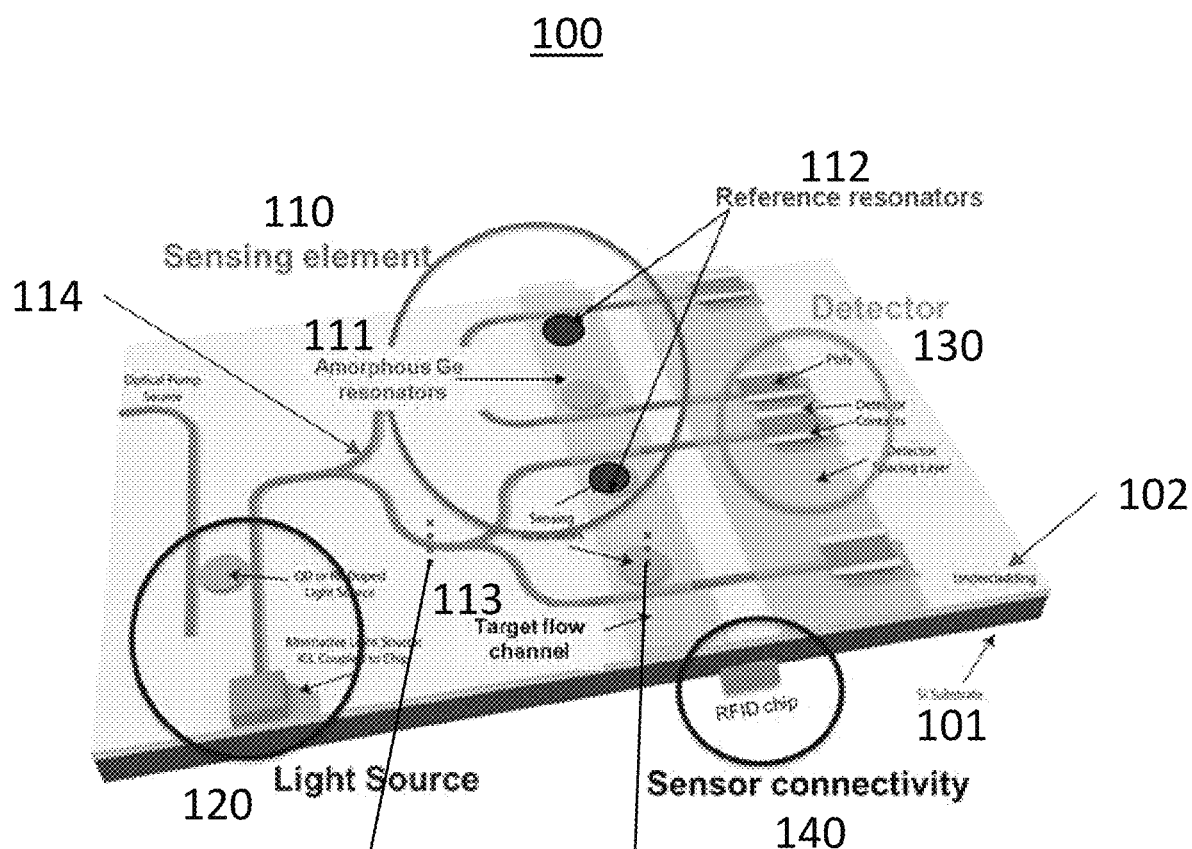
Figure 1B

2θ (degrees)

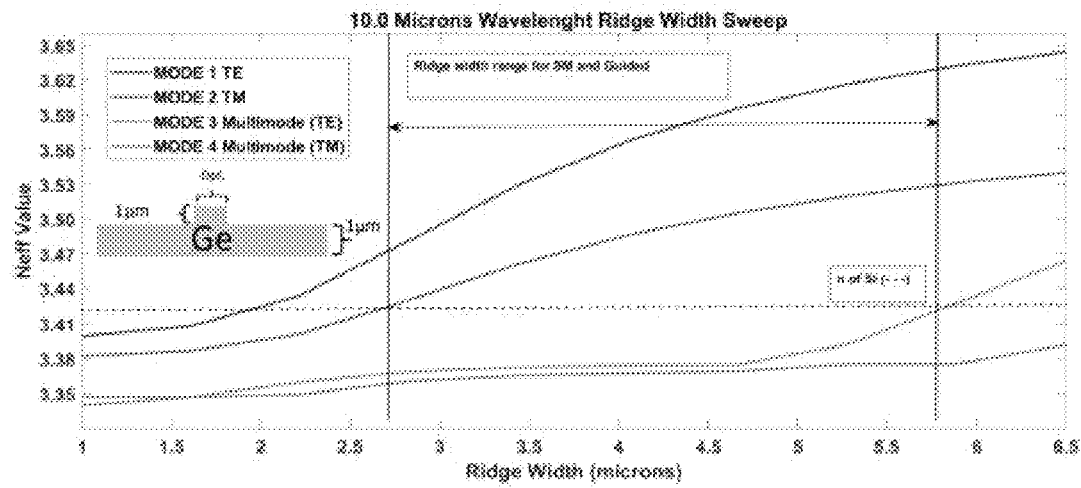
Figure 9A
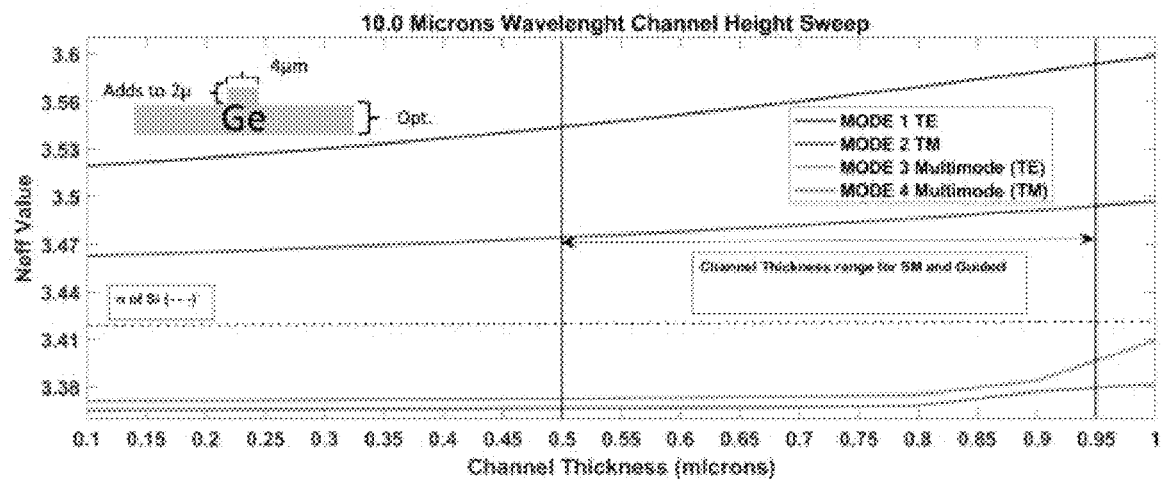
Figure 9B
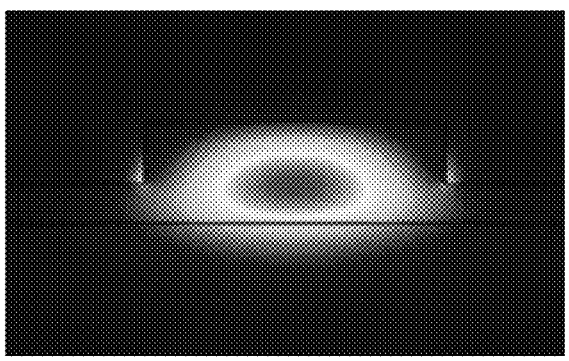 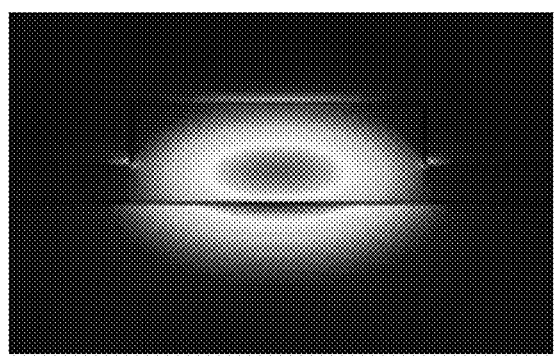
Figure 9C  Figure 9D

AMORPHOUS GERMANIUM WAVEGUIDES FOR SPECTROSCOPIC SENSING AND DATA COMMUNICATION APPLICATIONS

CROSS-REFERENCE TO RELATED APPLICATION(S)

This application is a divisional of U.S. application Ser. No. 16/691,007, filed Nov. 21, 2019, and entitled "Amorphous Germanium Waveguides for Spectroscopic Sensing and Data Communication Applications," which in turn claims the priority to U.S. Provisional Application Ser. No. 62/770,370, filed Nov. 21, 2018. Each of these applications is hereby incorporated by reference in its entirety for all purposes.

STATEMENT OF GOVERNMENT SUPPORT

This invention was made with government support under FA8702-15-D-0001 awarded by the U.S. Air Force. The government has certain rights in the invention.

BACKGROUND

Chemical sensors operating in the Mid-Wave Infrared (MWIR) and Long-Wave Infrared (LWIR) wavelength range of 3-11 µm are currently incompatible with complementary metal-oxide-semiconductor (CMOS) materials (e.g., Si, $SiO_2$, $SiN_x$). This incompatibility prevents integration with integrated circuit (IC) chips fabricated using CMOS technology. The result of this CMOS-incompatibility is more expensive and complicated chemical sensing systems.

In data communication, the current silicon-on-insulator (SOI) platform is more expensive than a platform based on $SiN_x$-on-$SiO_2$. The latter platform, however, requires a large bending radius for the waveguide. A large bending radius, in turn, increases the size and cost of the data communication device.

Amorphous germanium (Ge) has been studied, but problems have been reported regarding the material's optical and electronic properties. For example, high free carrier absorption in amorphous Ge has been reported, particularly when the carrier density is high. See Ukhanov Ju. I., "Optical Properties of Semiconductors", *Nauka* (1977); Vasiljeva M. A., L. E. Vorobyev and V. I. Stafeev, *Fiz. i Tekhn. Polupr.* 1, 1 (1967) 29-33. Moreover, non-ohmicity and structural non-uniformity have been reported in amorphous Ge, resulting in low mobility, light scattering, and high transmission loss. See P A. Walley and A K. Jonscher, "Thin Solid Films", 1, 367 (1967). These problems have stymied the adoption of amorphous Ge for use in waveguides.

SUMMARY

Amorphous Ge is deposited on a substrate at room temperature. The amorphous Ge is used as a waveguide for use in evanescent sensing and data communication applications in the MWIR and LWIR. Advantages of amorphous Ge waveguides include their ability to be used to sense a wide variety of organic molecules for both biomedical and environmental applications and their room temperature processing.

A layer of amorphous Ge is deposited on a substrate. The layer can be a thin film having a thickness of between 100 nm and 3000 nm. The amorphous Ge can be deposited on a variety of substrates, including $CaF_2$, $BaF_2$, ZnSe, or Si. The Si substrate can be a float zone silicon (FZ Si) substrate or Czochralski silicon (Cz-Si) substrate.

The layer of amorphous Ge has a low hole concentration p (<1e16 $cm^{-3}$), a high mobility (~10 $cm^2/Vs$), and good ohmicity. In terms of optical properties, ellipsometry shows an absorption coefficient of 0.1 $cm^{-1}$ at a wavelength of 8 µm. A waveguide made of amorphous Ge shows a low absorption loss of 2 dB/cm at a wide wavelength range including 8 µm.

Thin films of amorphous Ge can be obtained using various processing approaches: sputter deposition, electron beam evaporation (E-beam), and physical vapor deposition (or thermal evaporation). E-beam yielded the purest material, with 96% Ge and 4% carbon contamination, whereas thermal evaporation showed around 70% Ge and 30% of the film containing contaminants from the evaporation chamber. Ellipsometry performed on the amorphous Ge samples at a wavelength range of 1.5 to 15 µm showed that the index of refraction, n, of sputtered Ge had a lower range (2.9-3.4) than that of E-beam Ge (4-4.5). The extinction coefficients for both sputtered Ge and E-beam Ge are in a comparable range, 0 to 0.4, for the same measured wavelength range (1.5 to 15 µm), indicating low absorption losses within the material. X-Ray Diffraction confirms the amorphous nature of the deposited Ge.

Low loss amorphous germanium waveguides are fabricated using E-beam evaporation on a CMOS compatible LWIR-transparent FZ-Si substrate. A number of different structures and geometries were tested for the purpose of reducing the losses in the LWIR, including resonators, straight waveguides, and paperclip structured waveguides. The measured losses were approximately 2 dB/cm at a wavelength of 8 µm. An additional laser was added to extend the measurements to 9.79 µm, and the observed losses were on the order of 11 dB/cm.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A is a schematic of a chemical sensor system with amorphous Ge waveguides.

FIG. 1B is a magnified cross-sectional view of portions of the amorphous Ge waveguide of FIG. 1A.

FIGS. 9A-9D show results of simulations for a ridge waveguide structure designed for a 10-μm wavelength. FIG. 9A shows effective index $n_{eff}$ versus ridge width. FIG. 9B shows effective index $n_{eff}$ versus channel thickness. Images of the simulated TE and TM mode are also shown in FIGS. 9C and 9D, respectively.

Figure 10:
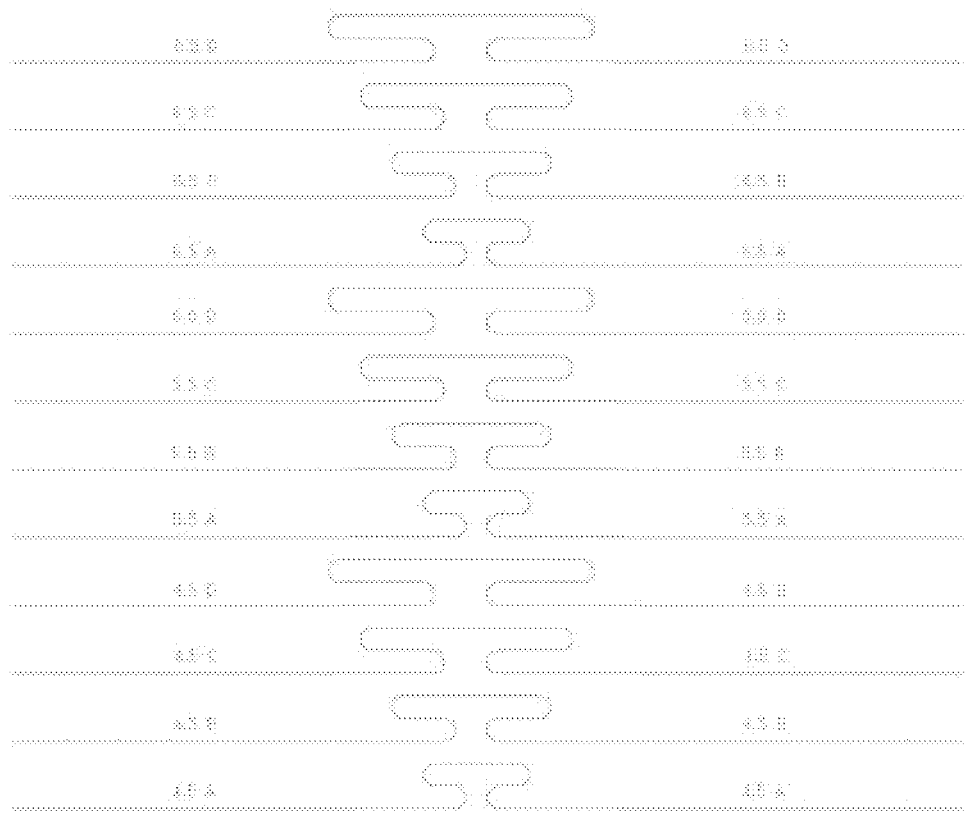

FIG. 10 is a schematic mask layout for fabrication showing straight waveguides and paperclips.

Figure 11:
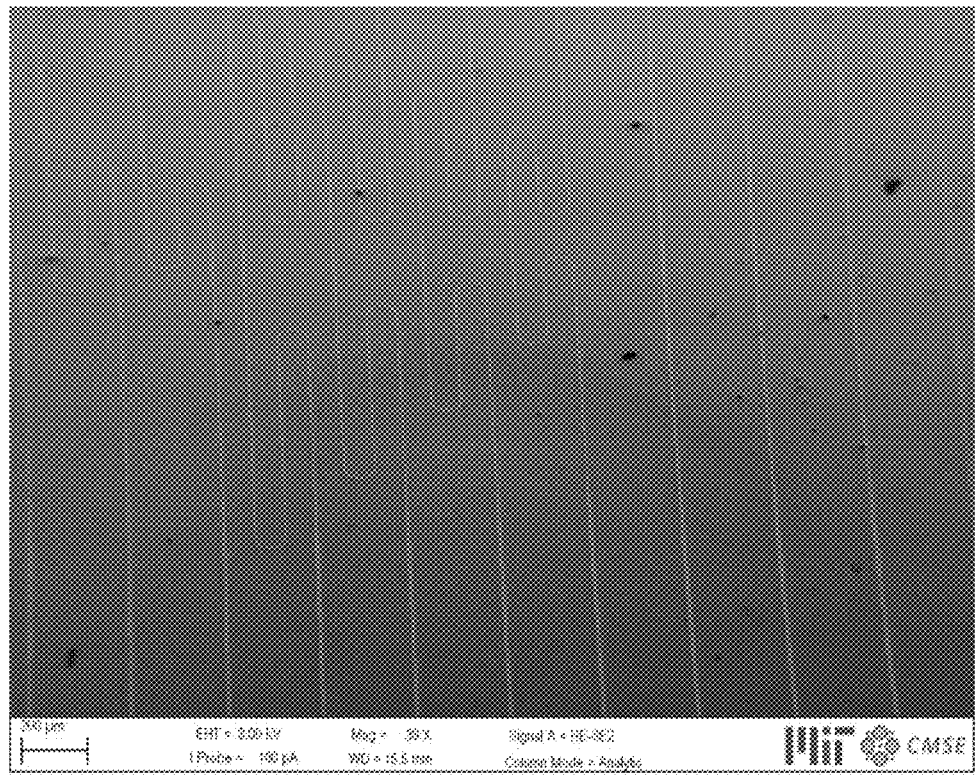

FIG. 11 is a scanning electron microscope (SEM) image of successful pattern development of paperclip cut-back structures and straight amorphous Ge-on-Si waveguides.

Figure 12A:
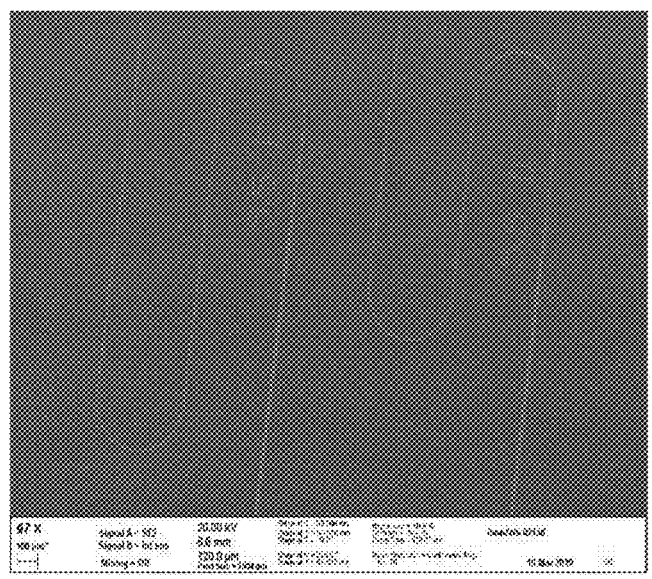
Figure 12B:
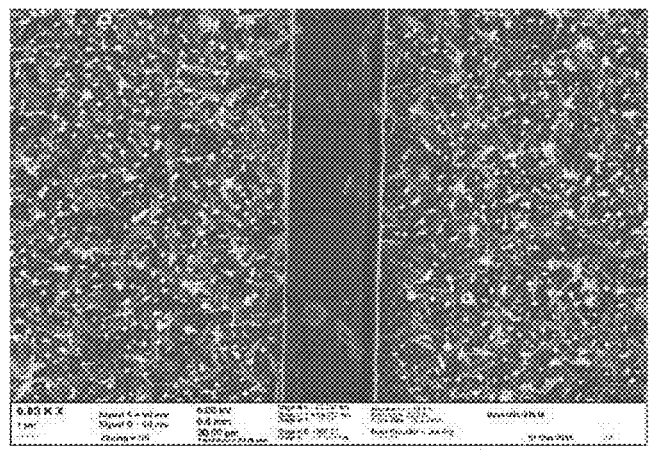
Figure 12C:
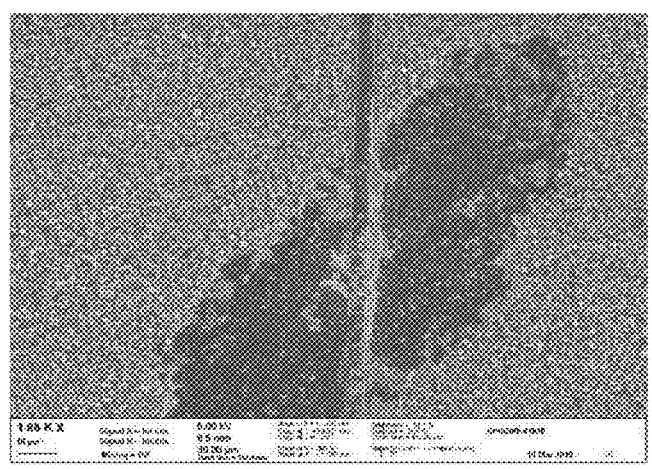

FIGS. 12A-12C show SEM images of etched amorphous Ge-on-Si waveguides. FIG. 12A is at 97× magnification, FIG. 12B is at 9,830× magnification, and FIG. 12C is at 1,860× magnification.

Figure 13A:
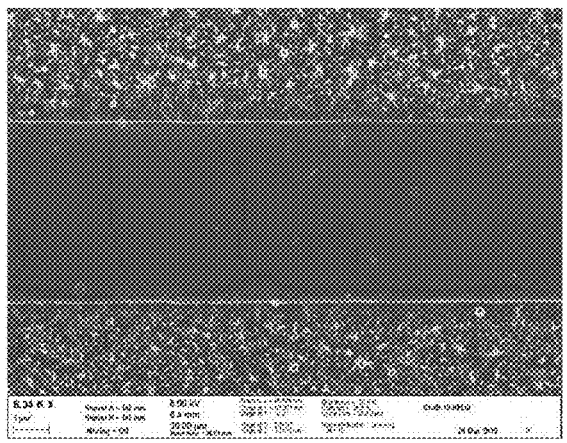
Figure 13B:
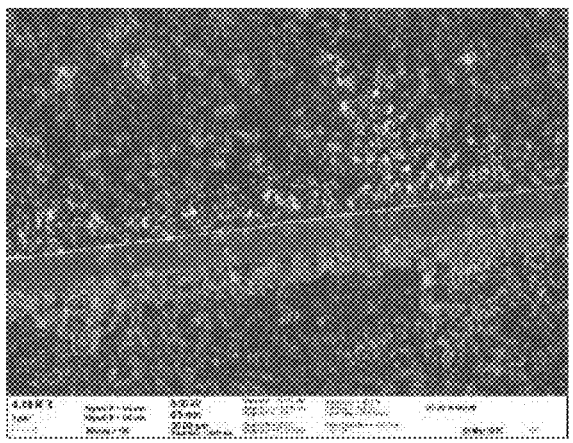

FIGS. 13A-13B show SEM images of chlorine-based etched amorphous Ge-on-Si waveguides. FIG. 13A is at 6,340× magnification and FIG. 13B is at 4,180× magnification.

Figure 14A:
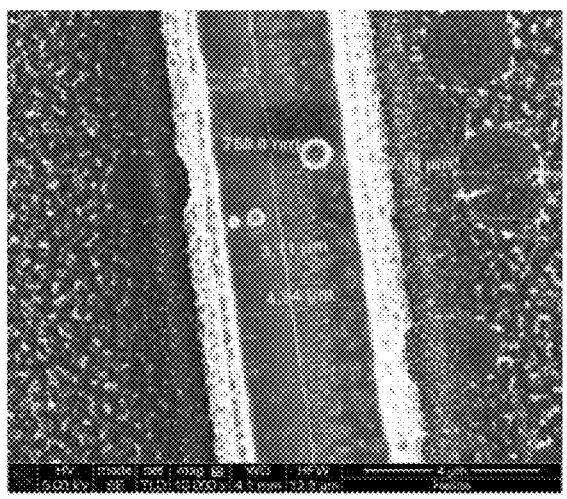
Figure 14B:
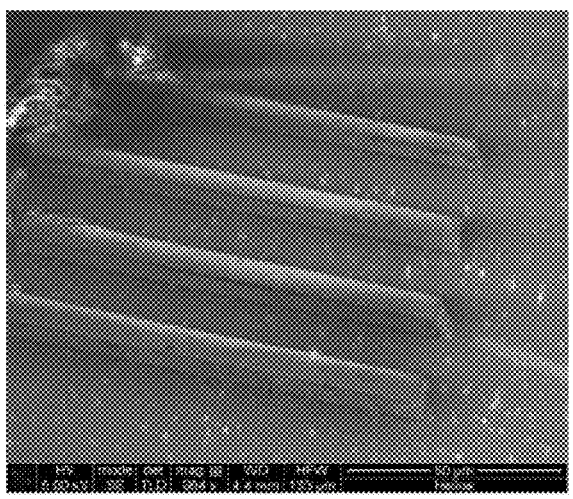

FIGS. 14A-14B show SEM images of fluorine-based etched amorphous Ge waveguides (FIG. 14A) and bromine-based etched amorphous Ge waveguides (FIG. 14B).

Figure 15:
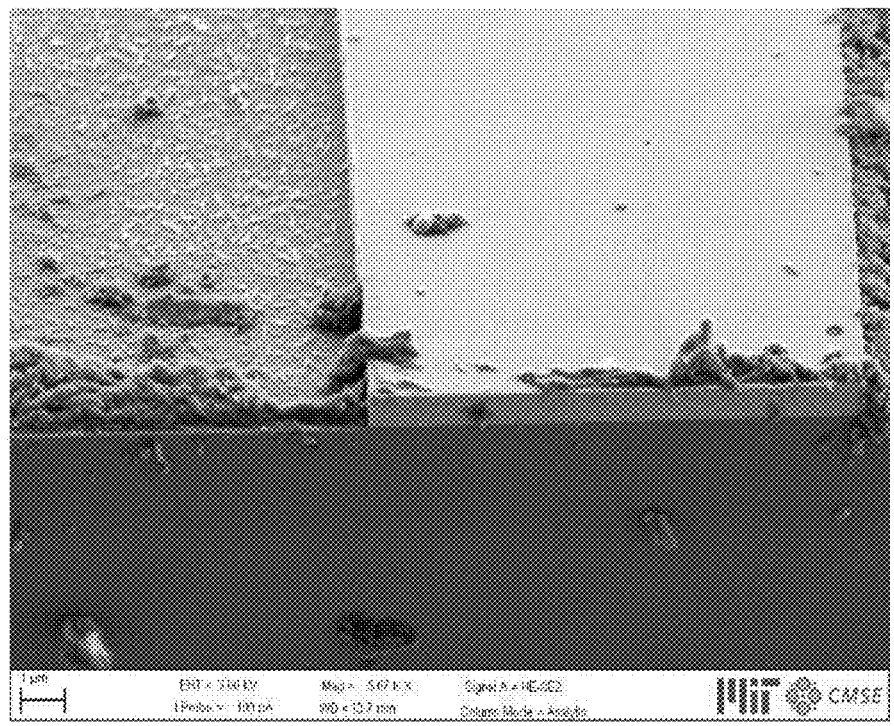

FIG. 15 shows a SEM image of an etched amorphous Ge-on-Si waveguide.

Figure 16:
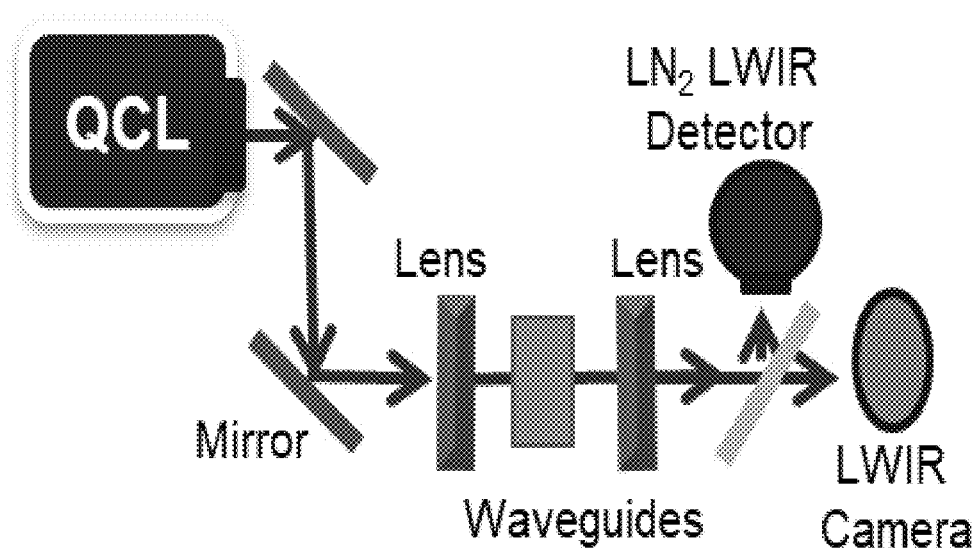

FIG. 16 is a schematic of a measurement set-up used to measure losses based on Fabry-Perot (FP) fringes within a waveguide.

Figure 17:
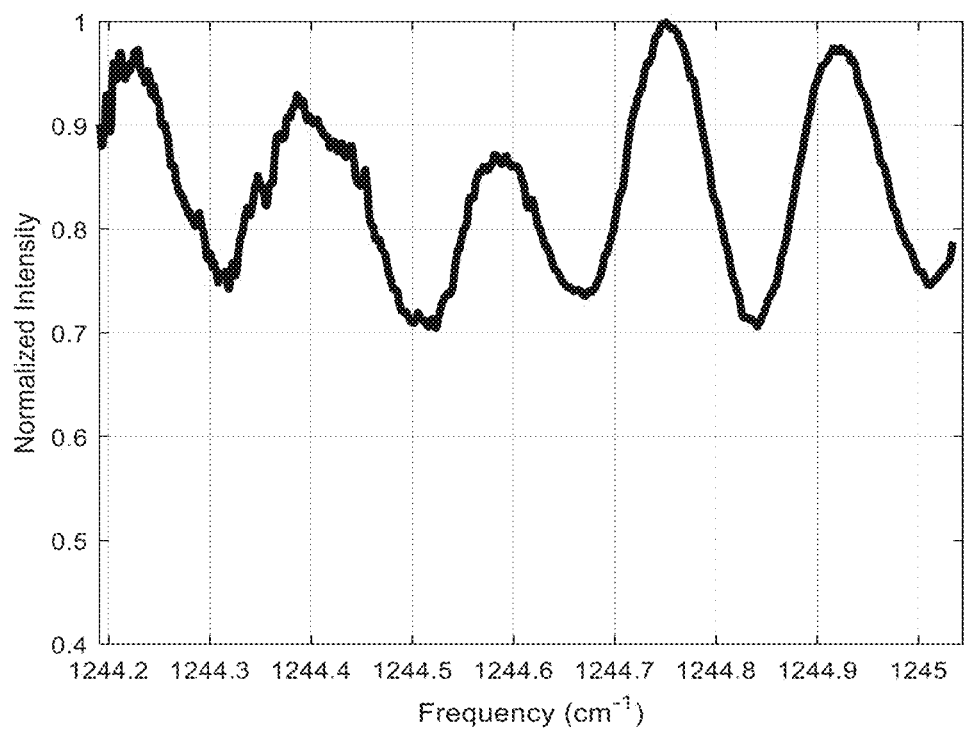

FIG. 17 is a plot of Transmitted Intensity vs Frequency (near a wavelength of 8 μm) for 15-μm wide amorphous Ge straight ridge waveguide on a FZ-Si substrate.

Figure 18:
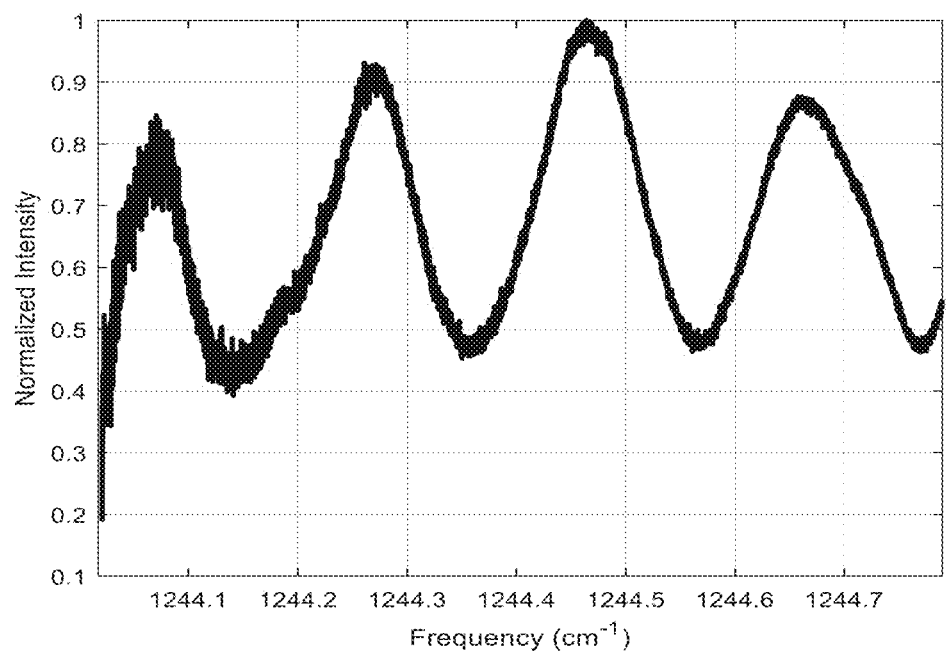

FIG. 18 is a plot of Transmitted Intensity vs Frequency (near a wavelength of 8 μm) for a 10-μm wide amorphous Ge paperclip waveguide on a FZ-Si substrate.

Figure 19:
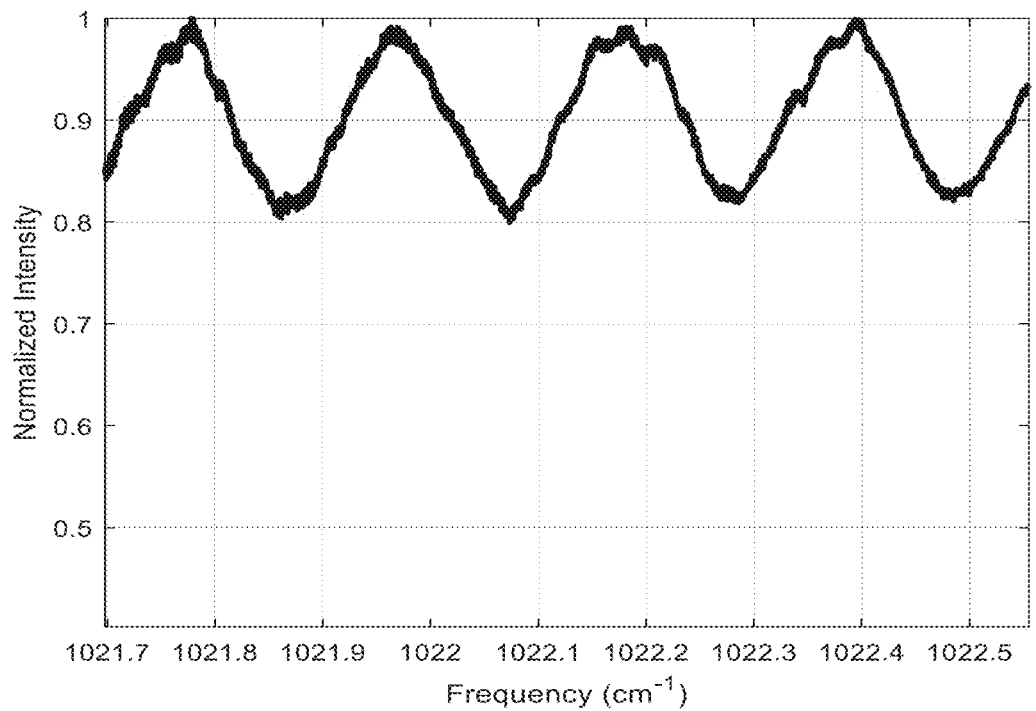

FIG. 19 is a plot of Transmitted Intensity vs Frequency (near a wavelength of 9.79 μm) for a 2-μm tall, 6.5-μm wide amorphous Ge straight waveguide on a float zone silicon substrate.

Figure 20:
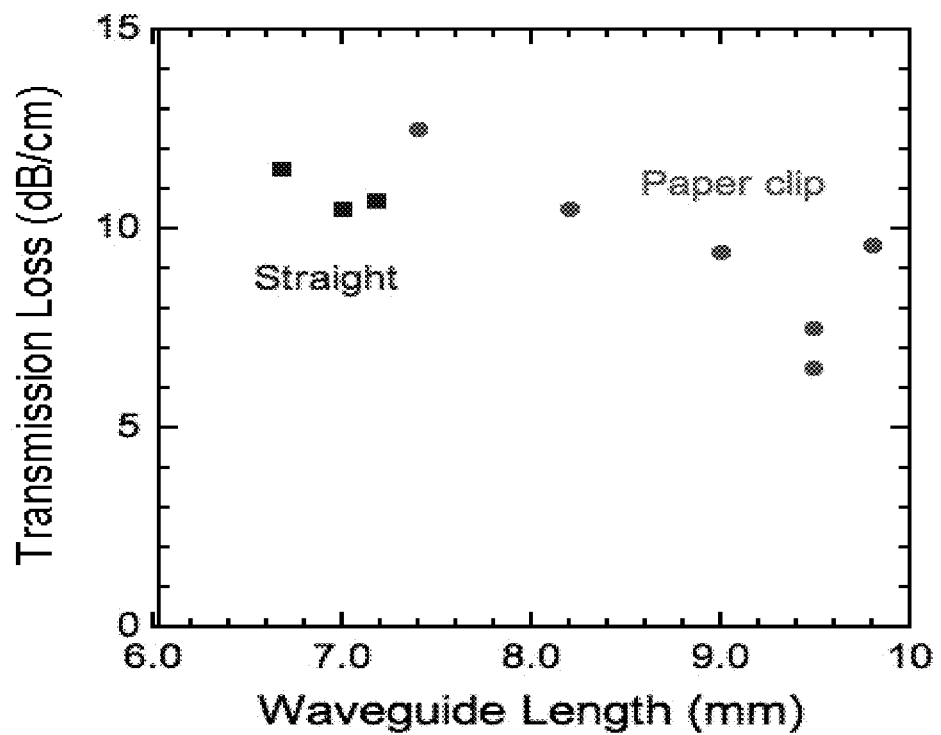

FIG. 20 is a plot of Transmission Loss (dB/cm) vs Waveguide Length, calculated using the Fabry Perot method.

DETAILED DESCRIPTION

Amorphous Ge Chemical Sensor System

Low loss amorphous Ge waveguides for MWIR and LWIR applications are disclosed. The wide transparency of Ge, especially in the chemical fingerprint wavelength region, makes it a prime candidate material for photonic chemical sensing in the MIR. CMOS-compatible amorphous Ge was deposited on substrates at room temperature, thereby avoiding crystalline platforms and high temperature processes. Hydrogen, fluorine, chlorine, or oxygen, is used to terminate dangling bonds in order to reduce defects and maintain MIR transparency by targeting a hole density ~1e15 $cm^{-3}$. The amorphous Ge films were characterized using a variety of methods to determine the absorption spectrum and complex refractive index.

Amorphous Ge waveguides in the 8-10 micron region were fabricated and characterized using a series of quantum cascade lasers (QCLs) operating in the MIR region. These low loss waveguides can serve as the key enabling sensing component in a high performance and low size, weight, power (SWaP) chemical sensor system 100, shown in FIG. 1A.

Sensor system 100 includes a substrate 101 and an undercladding 102. A light source 120 provides light to a sensing element 110 and a detector 130. The sensing element 110 includes amorphous Ge resonators, which include sensing resonators 111 and reference resonators 112. As depicted, the sensing resonators 111 and reference resonators 112 are ring resonators, but alternatively they may be microdisk resonators. The sensing resonators 111 and reference resonators 112 are disposed on a chemical/target flow channel. The sensing resonators 111 are configured to come into contact with the chemical target, while the reference resonators 112 do not. The detector 130 can include PbTe detectors disposed on a low index spacing layer. An RFID chip 140 facilitates sensor connectivity. Singh V, Lin P T, Patel N, et al. Mid-infrared materials and devices on a Si platform for optical sensing, *Sci Technol Adv Mater.* 2014; 15(1):014603, is incorporated by reference in its entirety.

The low loss amorphous Ge waveguides in system 100 are made using E-beam evaporation at room temperature. The amorphous Ge forms at least part of the resonators 111 and 112 and forms at least part of the connections 114 connecting the light source to the resonators 111 and 112 detector 130. For example, a continuous layer of amorphous Ge can form the connections 114 and resonators 111 and 112. FIG. 1B shows a magnified cross-sectional view of a connection 114 and of a portion of a ring resonator 112 at the locations marked by a dashed line in FIG. 1A. (The undercladding is omitted in FIG. 1B for simplicity.) As shown in FIG. 1B, the connection 114 and resonator 112 are made entirely of amorphous Ge and have substantially the same width and height. The substrate 101 is preferably a CMOS compatible LWIR-transparent substrate, such as float zone silicon (FZ-Si). The measured losses in the LWIR are approximately 2 dB/cm or less at a wavelength of 8 μm. Preferably, MIR transparency is maintained while achieving a hole density of ~1e15 $cm^{-3}$.

Amorphous Ge Deposition

Thin films (e.g., 300 nm) of amorphous Ge were grown using various processing approaches: Sputter Deposition, Electron Beam Evaporation (E-beam), and Physical Vapor Deposition (or thermal evaporation). Amorphous Ge was deposited on zinc selenide (ZnSe) and float zone silicon (FZ-Si) using E-beam. It was found that: sputtered a-Ge had high p ($1e^{18}$-$1e^{19}$ $cm^{-3}$) carriers, which induced free carrier absorption (FCA); and thermally evaporated, a-Ge had low p ($1e^{16}$ $cm^{-3}$) carriers due to non-uniform amorphous Ge. The low hole density was due to space charge limited current and the non-uniformity of the material can induce light scattering.

E-beam fabrication was carried out using an E-Beam AJA ATC with a graphite crucible at room temperature and a vacuum pressure: $2\text{-}3\times10^{-6}$ Torr. The electron beam current was ~65 mA (Potential: 8.2 KV (fixed), Power: 13-16% of max power (4100 W). The starting material was polycrystalline Ge (purity: 99.99%) and was deposited on ZnSe and Si. The evaporation time was 55 min (thickness: 1000 nm) at 3.2 Å/sec. The sample was unloaded 10 min after evaporation ended.

Preferably, the purity of the polycrystalline Ge starting material is at least 99.00%, or at least 99.90%, or at least 99.91%, or at least 99.92%, or at least 99.93%, or at least 99.94%, or at least 99.95%, or at least 99.96%, or at least 99.97%, or at least 99.98%, or at least 99.99%.

Preferably the electron beam current is greater than 30 mA, such as between 50 mA and 80 mA, or between 55 mA and 75 mA, or between 60 mA and 70 mA. Preferably the evaporation rate is between 1 Å/sec and 5 Å/sec, or between 2 Å/sec and 4 Å/sec, or between 2.5 Å/sec and 3.5 Å/sec, or between 3.0 Å/sec and 4.0 Å/sec. The evaporation time is between 10 min and 200 min, or between 20 min and 150 min, or between 30 min and 120 min, or between 40 min and 100 min.

E-beam fabrication of amorphous Ge layers is preferably performed in a high or ultra-high vacuum. For example, the vacuum level is preferably less than $1\times10^{-5}$ Torr, or less than $1\times10^{-6}$ Torr, or less than $1\times10^{-7}$ Torr, or less than $1\times10^{-8}$ Torr, or less than $1\times10^{-9}$ Torr, or less than $7.5\times10^{-10}$ Torr, or less than $1\times10^{-10}$ Torr.

E-beam fabrication of amorphous Ge layers is preferably performed at room temperature, without the application of external thermal energy to the crucible material or substrate other than the energy imparted by the electron beam. Preferably, immediately prior to starting the e-beam evaporation, the temperatures of the crucible material and substrate are less than 30° C. For example, the temperatures are between 15° C. and 25° C., or between 18° C. and 23° C., or between 20° C. and 22° C. Room temperature fabrication allows the amorphous Ge layers to be deposited on substrates that already have other layers or components fabricated on the substrate which might otherwise be damaged by high processing temperatures. This advantage allows for greater flexibility in the design and fabrication of devices.

Suitable substrates include $CaF_2$, $BaF_2$, ZnSe, Czochralski silicon (Cz-Si), and FZ-Si. FZ-Si substrates are advantageous because they having a low loss at a wavelength of 10 μm due to very low bulk oxygen concentration, and are relatively easy to cleave. FZ-Si has an oxygen concentration almost two orders of magnitude less than the oxygen concentration of Cz-Si. This lower oxygen concentration results in significantly less loss in the LWIR for FZ-Si.

Because taller waveguides are expected to have better performance (as predicted by Lumerical simulations discussed below), it is desirable to deposit thicker layers (approximately 2 μm) of amorphous Ge on float zone silicon (FZ-Si) using E-beam. Preferably, the thickness of the amorphous Ge layers is greater than 50 nm, or greater than 100 nm, or greater than 300, or greater than 500 nm, or greater than 1000 nm, or greater than 1500 nm, or greater than 2000 nm, or greater than 3000 nm. The thickness of the amorphous Ge layers can be between 100 nm and 3000 nm, or between 500 nm and 3000 nm, or between 1000 nm and 3000 nm, or between 1500 nm and 3000 nm, or between 1500 nm and 2500 nm.

Amorphous Ge Characterization

Figure 2:
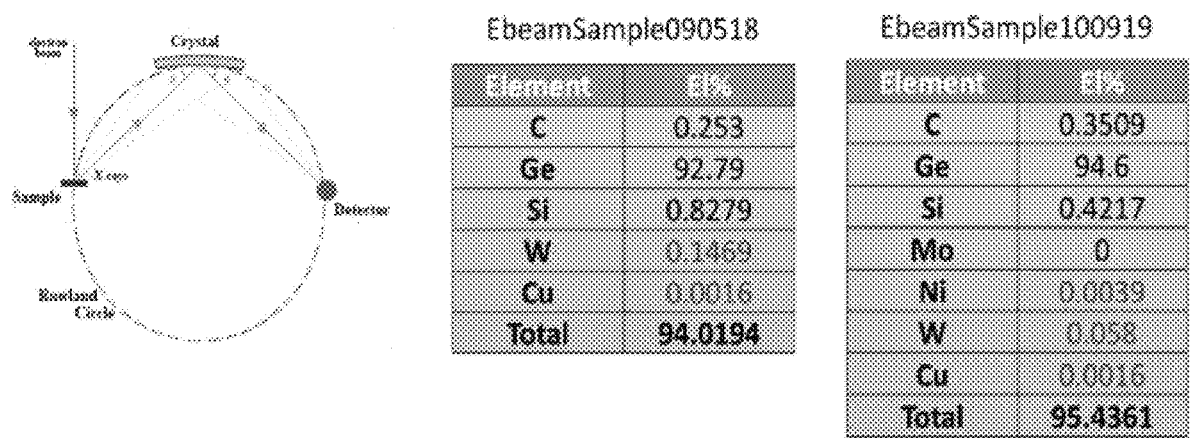
FIG. 2 is a schematic of a material characterization setup using Wavelength-Dispersive (Electron) Spectroscopy (WDS) and resulting data.

Films were characterized using Wavelength-Dispersive (Electron) Spectroscopy (WDS), and Ellipsometry. The WDS results indicated that E-beam yielded the purest material, with 96% Ge and 4% carbon contamination. The films deposited using thermal evaporation showed around 70% Ge, with the remaining 30% of the film being contaminants from the evaporation chamber. The majority of the contamination was Se, but As, S, Pb, Sb and Te were also found, as seen in FIG. 2. In order to reduce the contamination, efforts were taken to shield the walls of the thermal evaporator to obtain purer Ge films.

Preferably, the layer of amorphous Ge has a purity of at least 90% Ge, or at least 91% Ge, or at least 92% Ge, or at least 93% Ge, or at least 94% Ge, or at least 95% Ge, or at least 96% Ge, or at least 97% Ge.

Figure 3:
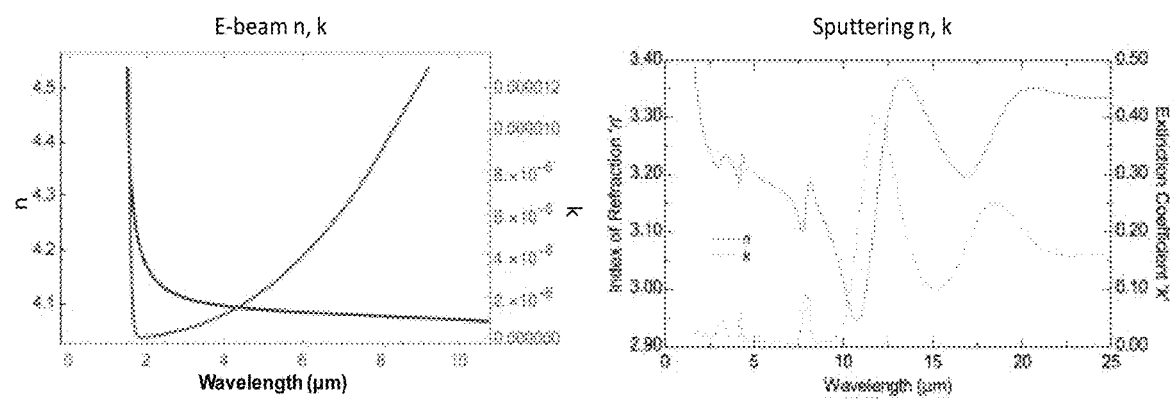
FIG. 3 is a plot of spectra of real (n) and imaginary (extinction coefficient, k) parts of the refractive index from measured ellipsometry data for 300 nm thick E-beam amorphous Ge films (left) and sputtered amorphous Ge films (right).
Figure 4:
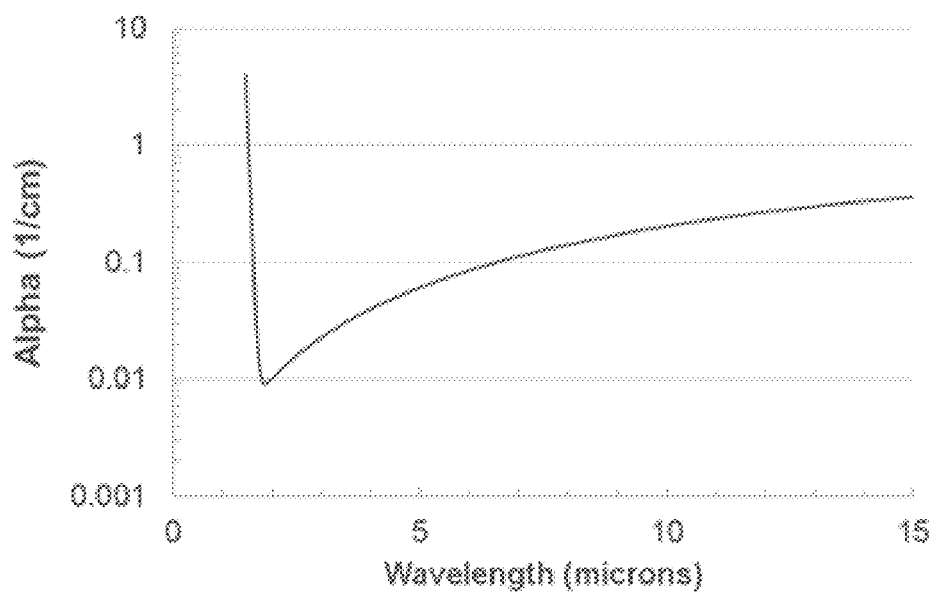
FIG. 4 is a plot of absorption coefficient (alpha) calculated from k for 300 nm thick E-beam-deposited amorphous Ge films.

Ellipsometry performed on the thermally evaporated 300 nm thick films of amorphous Ge at a wavelength range of 1.5 to 15 μm showed that the index of refraction, n, of sputtered Ge had a lower range (2.9-3.4) than that of E-beam Ge (4-4.5). The extinction coefficients for both sputtered Ge and E-beam Ge are in a comparable range, 0 to 0.4, for the same measured wavelength range (1.5 to 15 μm), indicating promisingly low absorption losses within the material. Spectra of real (n) and imaginary (extinction coefficient, k) parts of refractive index from measured ellipsometry data for 300 nm thick E-beam Ge films and sputtered Ge films are plotted in FIG. 3. Absorption loss (alpha) for the E-beam sample based on the k values from FIG. 3 is calculated and plotted in FIG. 4. Losses at 10 μm are approximately 0.2 $cm^{-1}$. X-ray Diffraction, Atomic Force Microscopy, and Hall Effect measurements were also performed on the samples.

Figure 5:
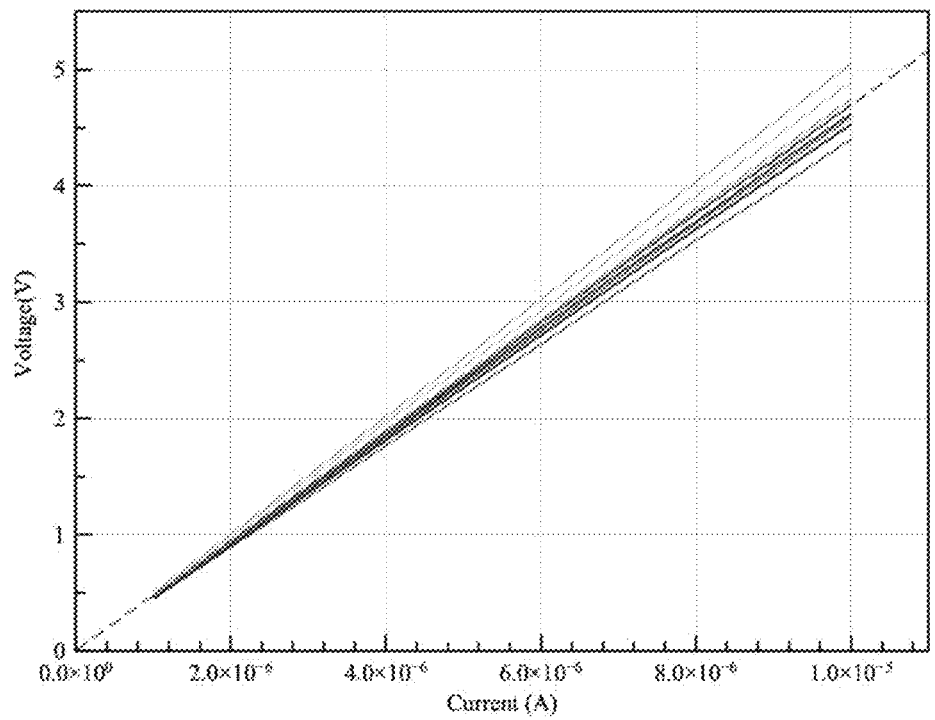
FIG. 5 is a current (I)-voltage (V) curve of amorphous Ge deposited on SOI.

Hall Effect measurements of amorphous Ge on SOI, using 20 nm TiN as a diffusion barrier, and 300 nm Al contacts are shown in FIG. 5. The plot shows the combination of 8 different probes to measure the voltage and current. The dashed line shows an extrapolation of the I-V curve to the origin. The amorphous Ge exhibited ohmic behavior with a sheet resistance of $2.12\times10^6$ Ohm and p type with a carrier concentration of 4.7e15 $cm^{-3}$ and mobility of 11.3 $cm^2/Vs$. Low carrier concentration results in low free carrier absorption.

Figure 6:
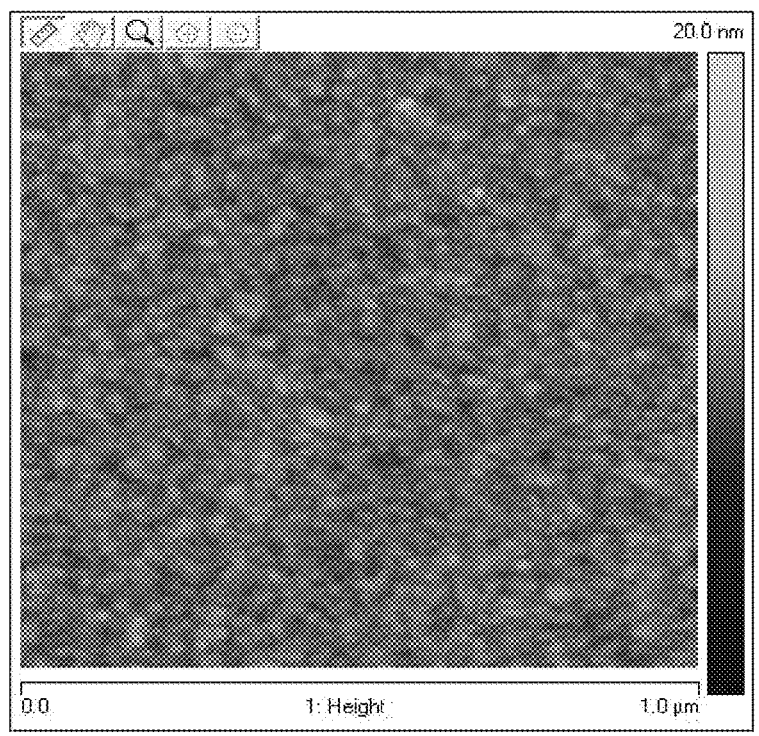
FIG. 6 is a tapping mode Atomic Force Microscope (AFM) height measurement performed on a 1-μm×1-μm area of 1 μm-thick amorphous Ge deposited using E-beam on SOI.

As shown in FIG. 6, tapping mode AFM was used to measure the surface roughness of a 1-μm thick amorphous Ge film deposited using E-beam on SOI. A root mean square (RMS) roughness of 0.811 Å is observed. The observed smoothness of amorphous Ge in FIG. 6 is expected to minimize losses due to scattering.

Figure 7:
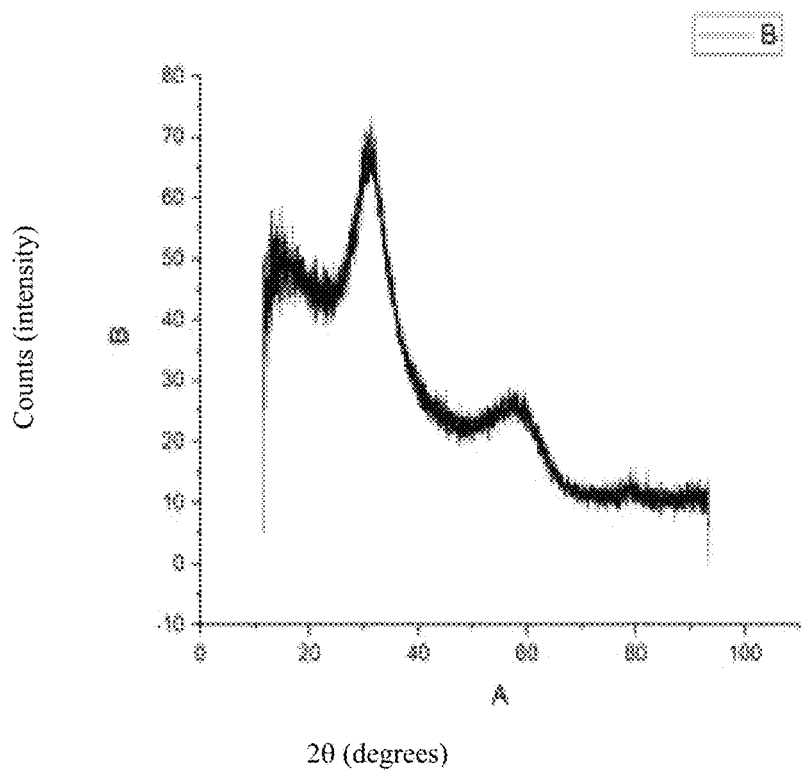
FIG. 7 is an X-ray diffraction (XRD) plot of E-beam evaporated amorphous Ge showing wide peaks indicative of an amorphous structure.

As shown in FIG. 7, X-ray diffraction was performed on the E-beam evaporated amorphous Ge. The large amorphous peaks in FIG. 7 are indicative of an amorphous structure.

Amorphous Ge Waveguide Design

Amorphous germanium-on-silicon waveguides for transmission near 10 μm wavelength were designed. To design the waveguides, Lumerical was used. Starting with amorphous Ge on ZnSe, the simulations showed that, for 1 μm thick Ge waveguide, a width of 3 μm supports a single TE mode. For resonators, the simulation showed that a submicron gap yields efficient coupling between the bus waveguide and the ring.

Switching to FZ-Si as the substrate for 1-μm thick amorphous Ge, the Lumerical simulations show that 7 μm was the cutoff waveguide width that would support a single mode, with 1.54% evanescent field in air. As the waveguide width increases, the amount of evanescent field in air increases, as seen in Table 1. In order to determine the optimal parameters for absorption-based measurements, waveguides that are 7, 8, 9, and 10 μm wide were included. Tapers were designed from 15 μm wide at the edge of the chip to the waveguide width, to improve coupling. Paperclip cut-back structures were also included in the loss measurements.

TABLE 1

Simulation results of TE fields versus waveguide widths that support mode propagation

| Waveguide Width (μm) | Percentage of field in Si substrate | Percentage of field in Ge Waveguide | Percentage of field in air (evanescence) |
|---|---|---|---|
| 7 | 79.81% | 18.65% | 1.54% |
| 8 | 74.34% | 23.73% | 1.93% |
| 9 | 71.16% | 26.69% | 2.15% |
| 10 | 69.22% | 28.49% | 2.28% |

Figure 8:
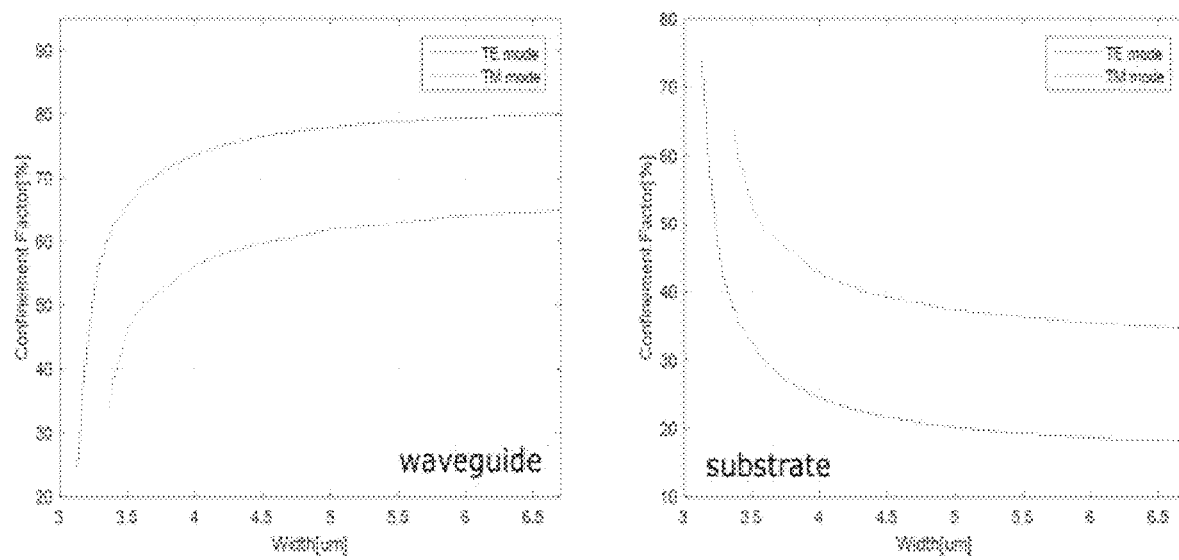
FIG. 8 shows results of simulations performed in Lumerical for TE and TM fields for various waveguide widths of a 2-μm thick amorphous Ge on FZ-Si waveguide.

Simulations were performed in Lumerical to determine the optimal dimensions of 2-μm thick amorphous Ge on FZ-Si waveguides. FIG. 8 shows results of simulations performed in Lumerical for TE and TM fields for various waveguide widths of a 2-μm thick amorphous Ge on FZ-Si waveguide.

To improve coupling, 300-μm long adiabatic tapers were designed from 15 μm width at the edge of the chip to the desired waveguide width (6.5 and 7.5 μm) at the center of the chip. The bend radius of paperclips was 200 μm, which was shown through simulations to yield low bending losses. Preferably, the bend radius is between 50 μm and 1000 μm, or between 100 μm and 500 μm, or between 150 μm and 300 μm.

Further simulations were conducted to develop ridge structures for 10 μm wavelength sensing that would further confine the mode and reduce the interaction of the mode with the sidewalls, thus reducing scattering losses. The simulation results are shown in FIGS. 9A-9D. It was found that the channel width should be between 2.6 μm and 6.7 μm (FIG. 9A), and the channel height should be between 0.5 μm and 0.95 μm to provide single-mode operation (FIG. 9B). Images of the simulated TE and TM mode are also shown in FIGS. 9C and 9D, respectively. Preferably, the channel width is between 1.0 μm and 10 μm, or between 1.5 μm and 7.5 μm, or between 2.0 μm and 7.0 μm, or between 2.6 μm and 6.7 μm. Preferably, the channel height is between 0.1 μm and 2.0 μm, or between 0.2 μm and 1.5 μm, or between 0.3 μm and 1.4 μm, or between 0.4 μm and 1.2 μm, or 0.5 μm and 0.95 μm.

FIG. 10 is a schematic mask layout including both straight waveguides as well as paperclips of varying widths and lengths. The waveguide designs were adapted for Fabry-Perot-fringe-based loss characterization, and for collinear input/output measurements.

Amorphous Ge Waveguide Fabrication

Develop Ge Waveguide Lithography Processing; Contact Lithography for Ge-On-Si Waveguides.

Glass contact masks were fabricated with resonators, straight waveguides, and paperclip structured waveguides. These masks were then utilized for contact lithography. A 1-μm thick amorphous Ge film was E-beam deposited on FZ-Si. Germanium oxide (GeO$_2$) is removed from the surface with a 2 second dip of the Ge on FZ-Si, in buffered oxide etch (BOE). Then, a hexamethyldisilazane (HMDS) treatment is applied to the surface of the Ge to improve adhesion between the Ge and the photoresist. Next, positive photoresist SPR-700 is spin coated on the chip, followed by a soft bake for 2 min at 100° C. to bake out any solvent in the resist. The pattern is exposed on the resist-coated chip with 436 nm light for 16 seconds, followed by development for 45-60 seconds in CD-26 (a tetramethylammonium hydroxide based developer). The chips are then hard baked at 110° C. for five minutes before etching using Reactive Ion Etching (RIE). FIG. 11 shows successful etching of the desired pattern.

SEM and optical microscope images of the waveguides showed that some waveguides did not remain intact during the processing, and sometimes a fine residue was observed on them as shown in FIGS. 12A-12C. This fine residue is observed as a stain on FIG. 12C, possibly related to post-process contamination during cleaving; and as "grass" on FIG. 12B, possibly due to redeposition of resist and/or Ge during the etching step.

Using the same mask layout, a second deposition and fabrication run was performed, but this time a 2-μm thick amorphous Ge film was deposited instead of the previous 1-μm thickness. Also, a Maskless Aligner technology (MLA) direct-write system was used instead of UV contact lithography, in order to improve the repeatability of the lithography process. After this second run, the waveguides remained intact, however "grass" was still observed as shown in FIGS. 13A-13B.

Develop Ge Waveguide Lithography Processing; E-Beam Lithography Development for Ge-On-ZnSe Waveguides.

E-beam lithography was used to pattern a negative photoresist on Ge-on-ZnSe. The negative photoresist is advantageous because it reduces E-beam writing time. To start, a dose test is performed for E-beam to obtain the right dose for submicron gap resolution. Because Ge shows charging issues with E-beam due to its high resistivity, a conductive polymer was spun on the amorphous Ge before E-Beam lithography. This solved the charging problem. The negative photoresist (Fox16) uses 25% TMAH for development. In order to fabricate waveguides to measure losses, waveguides were fabricated using a contact mask and a positive photoresist (SPR-700) using the same process outlined above for Ge-on-Si. The developer for SPR-700, CD-26, uses 2.6% of TMAH. This developer did not show any adhesion of amorphous Ge on ZnSe. HMDS treatment helps to eliminate the problem of some of the narrow waveguides breaking after the development step.

Development and Optimization of Etching Recipe

A chlorine based amorphous Ge etching recipe was developed. Using 10 sccm of Cl$_2$ and 10 sccm of BCl$_3$ at a pressure of 10 mTorr and 150 W power, an etching rate of 200 nm/minute was obtained. The etching selectivity of the resist and Ge was 1:2.5. FIG. 15 shows an SEM image of a successfully etched amorphous Ge-on-Si waveguide. The dirt surrounding the waveguide occurred due to cleaving and is removed using isopropyl alcohol (IPA) and ultrasonic cleaning.

Additional etch chemistries were examined. FIGS. 14A and 14B show the results of etching performed using fluorine- and bromine-based plasma etching, respectively. The fluorine-based etch was performed with 30 sccm CF$_4$ and 5 sccm O$_2$ at 30 mTorr, at an etch rate of amorphous Ge of 100 nm/min. As shown in FIG. 14A, the fluorine-based etch produced "grass", most likely due to redeposition of resist, though less grass seemed to be produced than the chlorine-based etch. The bromine-based etch was performed using HBr gas. Suitable etching parameters for the HBr gas include: 10 sccm to 50 sccm, at a power of 300 W to 800 W (for example 600 W), and at a pressure of 1 mTorr to 30 mTorr. As shown in FIG. 14B, the bromine-based etch produced very smooth sidewalls and a very smooth surface as well as straight sidewalls, showing great promise in reduction of scattering losses due to sidewall roughness. Thus, fabrication of waveguides preferably utilizes a bromine-based etch (e.g., HBr gas), coupled with the photoresist FoX-16, which improves transmission loss by reducing scattering losses from rough sidewalls.

Amorphous Ge Waveguide Characterization

FIG. 16 shows the measurement setup used to measure losses based on Fabry-Perot (FP) fringes within the amorphous Ge waveguides. The setup includes a Thorlabs distributed feedback (DFB) QCL operating at 8 µm and a Corning DFB operating at 9.79 µm. In addition to the DFB operating at 9.79 µm, a mode-hop-free Daylight solutions Quantum Cascade Laser was also used to extend the measurement range to 9.6-10 µm. The laser power was coupled into the waveguide using mode-matching relay optics. A fast microscope objective collected the beam exiting the resonator. A LWIR camera aided in alignment and coupling of the laser into the waveguide. The edge facets on either end, with the waveguide in between, provided a Fabry-Perot resonator structure which was evaluated. The outcoming beam was either collected by a liquid $N_2$ cooled Infrared Associates detector or imaged using a FLIR camera.

FIG. 17 shows the transmission measurement for a 15-µm wide, 0.68-mm long straight ridge amorphous Ge waveguide. From the measurement, the losses were determined to be ~11 dB/cm based on the equations given in R. Regener and W. Sohler Appl. Phys. B 36, 143-147 (1985), and D. F. Clark and M. S. Iqbal Opt. Lett. 15(22) 1291-1293 (1990), both of which are incorporated by reference in their entirety. The loss, α, is determined from the equation:

$$\alpha\ (db/cm) = -4.34/\text{Length} \times (\ln(\gamma/2R)),$$

where γ is the fringe contrast, which is the ratio of the peaks and valleys and can be expressed as γ=(Peak−Valley)/(Peak+Valley). The Reflectivity is calculated from the Fresnel equation where $R=[(1-n_{\mathit{eff}})/(1+n_{\mathit{eff}})]^2$. The effective index $n_{\mathit{eff}}$ is determined from the fringe spacing or Free Spectral Range (FSR), where FSR=1/(2×Length×$n_{\mathit{eff}}$). The Fresnel reflection equations assumes light is a plane wave and breaks down for a high index contrast waveguide and may underestimate transmission loss.

FIG. 18 shows the transmission measurement for a 10-µm wide, 0.9-mm long paperclip amorphous Ge waveguide. From this measurement, the losses are approximately 2 dB/cm or less.

FIG. 19 shows the transmission measurement for a 2-µm tall, 6.5-µm wide, 0.7-mm long straight ridge waveguide processed using the improved direct-write system. The mode hop free Daylight solutions Quantum Cascade Laser was used to measure the losses in the 9.6-10 µm region. From the measurement, the losses were determined to be ~11 dB/cm. Low loss results can be achieved consistently by improving the etching and processing, for example, by reducing sidewall roughness as characterized by the SEM images discussed previously.

TABLE 2 summarizes the loss measurements taken using a DFB laser at 9.79 µm. For the sake of completeness, data from a straight waveguide using a different wavelength is also included. The loss data shows a large variability depending on several experimental factors such as (i) type of waveguide: straight waveguide versus paperclip; (ii) height: 1 µm or 2 µm; (iii) waveguide width: larger (15 µm width) or smaller (6.5 µm width), starting taper at the edge; and (iv) wavelength: characterized at 8.03 µm, or 9.79 µm, or 10 µm wavelength. FIG. 20 plots the transmission loss (dB/cm) for the two waveguide shapes (straight and paperclip), calculated using the Fabry Perot method, as a function of waveguide length, centered on 10 dB/cm.

TABLE 2

Summary of loss measurements for various waveguides fabricated

| Height (µm) | Width (µm) | Length (mm) | Shape | Neff | R | Loss (dB/cm) λ = 9.79 µm |
|---|---|---|---|---|---|---|
| 1 | 15 | 6.68 | Straight | 4.3 | | 11.5 × λ = 8.03 µm |
| 1 | 8 | 7.398 | Paperclip | 3.1 | 0.26 | 12.5 |
| 1 | 8 | 8.198 | Paperclip | 2.6 | 0.22 | 10.5 |
| 1 | 8 | 8.998 | Paperclip | 2.6 | 0.20 | 9.4 |
| 1 | 8 | 9.798 | Paperclip | 2.4 | 0.22 | 9.6 |
| 2 | 7.5 | 9.49 | Paperclip | 2.4 | 0.17 | 7.5 |
| 2 | 7.5 | 7.18 | Straight | 3.3 | 0.29 | 10.7 |
| 2 | 6.5 | 9.49 | Paperclip | 2.4 | 0.17 | 6.5 |
| 2 | 6.5 | 10.98 | Paperclip | 2.0 | 0.11 | 4.1 |
| 2 | 6.5 | 7 | Straight | 3.4 | 0.32 | 10.5 |

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, when a numerical range is expressed in terms of two values connected by the word "between," it should be understood that the range includes the two values as part of the range.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of forming amorphous Ge on a substrate, the method comprising:
    performing electron-beam evaporation of a starting material comprising polycrystalline Ge, until a layer of amorphous Ge is formed on a substrate; and
    etching a portion of the layer of amorphous Ge using HBr gas;
    wherein:
        the starting material has a purity of at least 99.00%;
        the evaporation is performed in a vacuum chamber having a pressure not greater than $1 \times 10^{-5}$ Torr;
        immediately prior to evaporation, the temperatures of the starting material and substrate are not greater than 30° C.;
        the evaporation is performed using an electron-beam current of at least 30 mA; and
        at the conclusion of the evaporation, the layer has a thickness of at least 50 nm and a purity of at least 90% Ge.

2. The method of claim 1, wherein the substrate comprises a $CaF_2$, $BaF_2$, ZnSe, Czochralski silicon (Cz-Si), or float zone silicon (FZ-Si) substrate.

3. The method of claim 2, wherein the substrate comprises a FZ-Si substrate.

4. The method of claim 1, wherein the starting material has a purity of at least 99.97%.

5. The method of claim 1, wherein the temperatures are from 15° C. to 25° C.

6. The method of claim 1, wherein the electron-beam current is 50 mA to 80 mA.

7. The method of claim 1, wherein the thickness of the layer is 100 nm to 3000 nm, and the purity of the layer is at least 95% Ge.

8. The method of claim 1, wherein the evaporation is performed for 10 min to 200 min at a rate of 1 Å/sec to 5 Å/sec.

9. A method of forming amorphous Ge on a substrate, the method comprising:
    performing electron-beam evaporation of a starting material comprising polycrystalline Ge, until a layer of amorphous Ge is formed on a substrate;
    wherein:
        the starting material has a purity of at least 99.00%;
        immediately prior to evaporation, the temperatures of the starting material and substrate are not greater than 30° C.;
        the evaporation is performed using an electron-beam current of at least 30 mA;
        at the conclusion of the evaporation, the layer has a thickness of at least 50 nm and a purity of at least 90% Ge, and
        the evaporation is performed in the vacuum chamber having a pressure of about $2 \times 10^{-6}$ Torr to about $3 \times 10^{-6}$ Torr.

10. The method of claim 9, wherein the substrate comprises a $CaF_2$, $BaF_2$, ZnSe, Czochralski silicon (Cz-Si), or float zone silicon (FZ-Si) substrate.

11. The method of claim 9, wherein the temperatures are from 15° C. to 25° C.

12. A method of forming amorphous Ge on a substrate, the method comprising:
    performing electron-beam evaporation of a starting material comprising polycrystalline Ge, until a layer of amorphous Ge is formed on a substrate;
    removing $GeO_2$ from a surface of the layer of amorphous Ge;

treating the surface of the layer of amorphous Ge with an organosilicon compound;
applying a photoresist layer onto the surface of the layer of amorphous Ge;
patterning the photoresist layer to expose a portion of the surface of the layer of amorphous Ge; and
etching the portion of the surface of the layer of amorphous Ge;
wherein:
   the starting material has a purity of at least 99.00%;
   the evaporation is performed in a vacuum chamber having a pressure not greater than $1 \times 10^{-5}$ Torr;
   immediately prior to evaporation, the temperatures of the starting material and substrate are not greater than 30° C.;
   the evaporation is performed using an electron-beam current of at least 30 mA; and
   at the conclusion of the evaporation, the layer has a thickness of at least 50 nm and a purity of at least 90% Ge.

13. The method of claim 12, wherein etching the portion of the surface of the layer of amorphous Ge comprises plasma etching using HBr gas.

14. The method of claim 13, wherein plasma etching is performed using a gas flow of about 10 sccm to about 50 sccm and a power of about 300 W to about 800 W at a pressure of about 1 mTorr to about 30 mTorr.

15. The method of claim 12, wherein etching the portion of the surface of the layer of amorphous Ge forms at least one amorphous Ge waveguide having a channel width of 1.0 μm to 10 μm and a channel height of 0.5 μm to 2.0 μm.

16. The method of claim 15, wherein the at least on amorphous Ge waveguide has a transmission loss of 11 dB/cm or less at a wavelength of 8 μm.

17. The method of claim 15, wherein the at least on amorphous Ge waveguide has a transmission loss of 2 dB/cm or less at a wavelength of 8 μm.

18. The method of claim 15, wherein etching the portion of the surface of the layer of amorphous Ge forms at least part of a resonator, a straight waveguide, or a paperclip structured waveguide.

19. A device for chemical sensing comprising the at least one amorphous Ge waveguide formed by the method of claim 15.

20. A device for data communications comprising the at least one amorphous Ge waveguide formed by the method of claim 15.

* * * * *